(12) United States Patent
Fukami

(10) Patent No.: US 9,553,067 B2
(45) Date of Patent: Jan. 24, 2017

(54) SEMICONDUCTOR DEVICE

(71) Applicant: Takeshi Fukami, Toyota (JP)

(72) Inventor: Takeshi Fukami, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/029,393

(22) PCT Filed: Aug. 4, 2014

(86) PCT No.: PCT/JP2014/070519
§ 371 (c)(1),
(2) Date: Apr. 14, 2016

(87) PCT Pub. No.: WO2015/093090
PCT Pub. Date: Jun. 25, 2015

(65) Prior Publication Data
US 2016/0284660 A1  Sep. 29, 2016

(30) Foreign Application Priority Data

Dec. 20, 2013  (JP) ................................. 2013-263931

(51) Int. Cl.
*H01L 23/48* (2006.01)
*H01L 23/00* (2006.01)

(52) U.S. Cl.
CPC ..... *H01L 24/29* (2013.01); *H01L 2224/29076* (2013.01); *H01L 2924/01006* (2013.01); *H01L 2924/01013* (2013.01); *H01L 2924/0483* (2013.01); *H01L 2924/07025* (2013.01); *H01L 2924/3512* (2013.01)

(58) Field of Classification Search
CPC .............. H01L 2924/3512; H01L 2924/01006; H01L 2924/0483; H01L 2924/07025; H01L 2924/01013; H01L 2224/3225; H01L 2224/73267; H01L 2224/8203; H01L 2224/04105; H01L 2224/24226; H01L 2224/92244; H01L 2224/02; H01L 24/29; H01L 24/25; H01L 24/24; H01L 24/82
See application file for complete search history.

(56) References Cited

U.S. PATENT DOCUMENTS

2013/0026622 A1*  1/2013  Chuang ................... H01L 24/11
257/737

FOREIGN PATENT DOCUMENTS

JP    2011-023631 A    2/2011
JP    2013-211497 A    10/2013

* cited by examiner

*Primary Examiner* — (Vikki) Hoa B Trinh
(74) *Attorney, Agent, or Firm* — Oliff PLC

(57) ABSTRACT

A semiconductor device includes a semiconductor layer, an electrode layer arranged on the semiconductor layer, a crack starting point layer arranged above the semiconductor layer, and a solder layer being in contact with the electrode layer and the crack starting point layer. A joining force between the solder layer and the crack starting point layer is smaller than a joining force between the solder layer and the electrode layer.

3 Claims, 5 Drawing Sheets

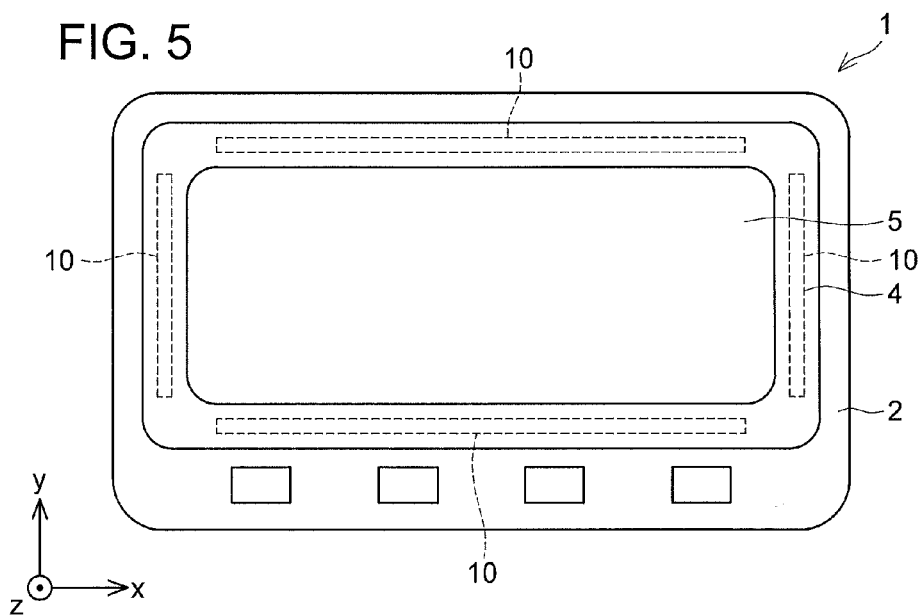
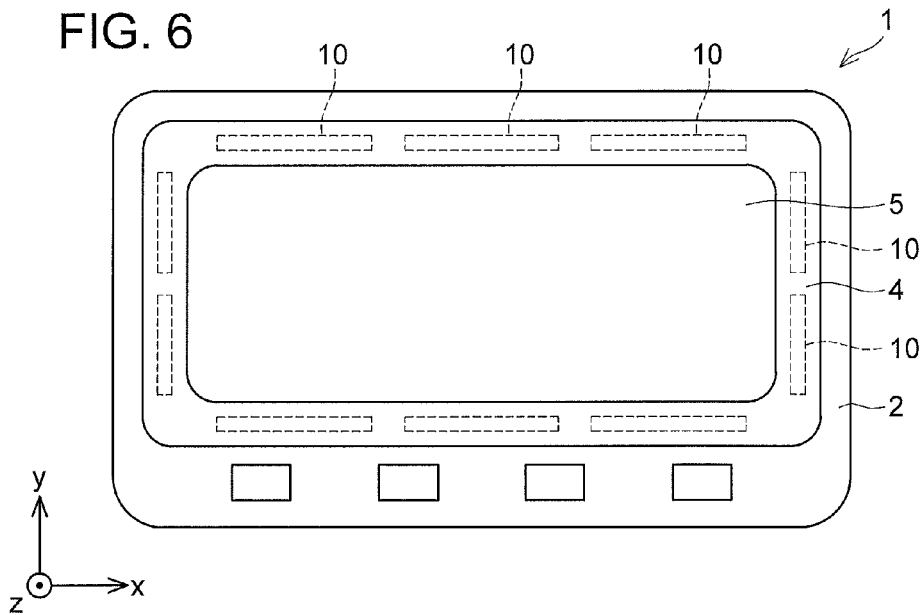

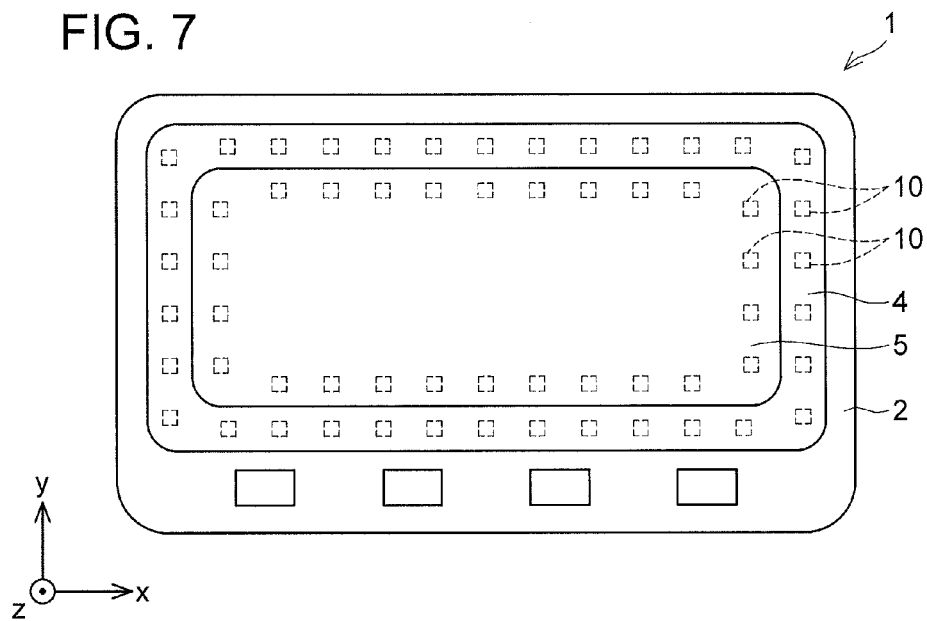
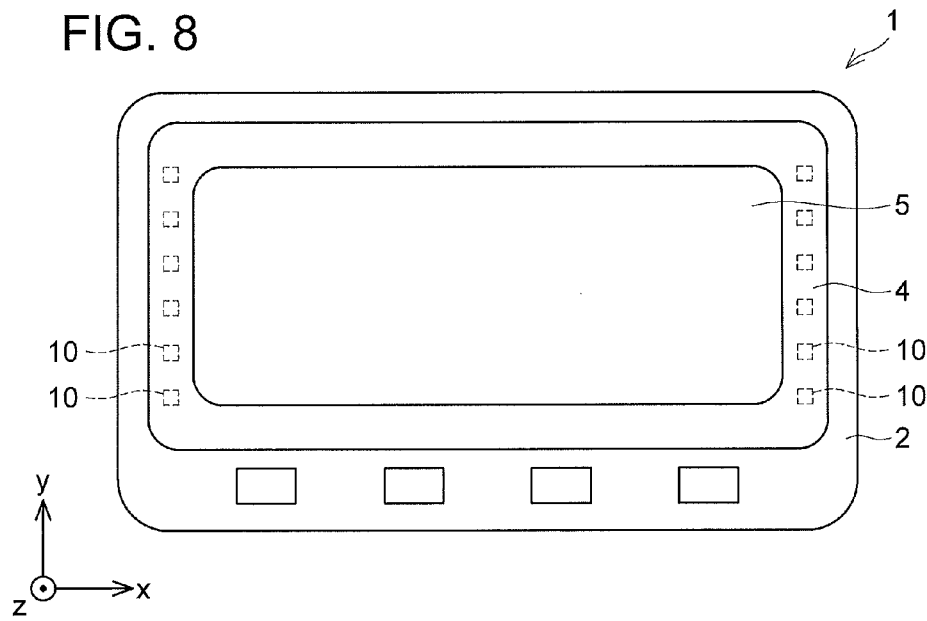

US 9,553,067 B2

SEMICONDUCTOR DEVICE

TECHNICAL FIELD

The present teachings relate to a semiconductor device.

BACKGROUND ART

In a general semiconductor device, due to a temperature cycle in which a temperature of the semiconductor device repeatedly rises and falls during its use, there may be a case where a stress is exerted on an inside of the semiconductor device and a crack (cracking) occurs. Patent Literature 1 (Japanese Patent Application Publication No. 2011-023631) discloses an art for improving resistance to cracks that occur in a semiconductor device. A configuration disclosed in Patent Literature 1 includes a semiconductor element, and an electrode layer arranged to face the semiconductor element. Moreover, this configuration includes an intermediate joint layer and a solder joint layer on a surface of the semiconductor element that faces the electrode layer. Moreover, semiconductor element protection resin is provided in a coating manner on the semiconductor element, and at least in an outer peripheral surface region between the intermediate joint layer and the solder joint layer.

SUMMARY

Technical Problem

In the art in Patent Literature 1, by providing the semiconductor element protection resin, crack resistance of the semiconductor device is improved. However, even in the art in Patent Literature 1, there is a possibility that a crack occurs when a stress is exerted on the inside of the semiconductor device due to the temperature cycle. Moreover, when a crack occurs, the crack may run into the electrode layer. The present teachings therefore have an object of providing a semiconductor device in which a crack is less likely to run into its electrode layer.

Solution to Technical Problem

A semiconductor device disclosed herein comprises a semiconductor layer, an electrode layer arranged on the semiconductor layer, a crack starting point layer arranged above the semiconductor layer, and a solder layer being in contact with the electrode layer and the crack starting point layer. A joining force between the solder layer and the crack starting point layer is smaller than a joining force between the solder layer and the electrode layer.

According to such a configuration, when a stress is exerted on an inside of the semiconductor device due to the temperature cycle, the crack starting point layer serves as a starting point of a crack, and the crack runs into the solder layer prior to the electrode layer. If the crack starting point layer does not exist, there is no trigger for the generation of a crack, and hence the crack may run, not into the solder layer but into the electrode layer. In contrast, according to the above-described configuration, the crack runs into the solder layer, allowing the crack starting point layer to serve as a trigger. Accordingly, it can be ensured that a crack is less likely to run into the electrode layer.

In the semiconductor device as above, the crack starting point layer may be arranged on the electrode layer, and a thickness of the crack starting point layer may be smaller than a width of the crack starting point layer.

Further, the electrode layer may be made of a material that forms an alloy more easily with the solder layer than the crack starting point layer.

Further, the crack starting point layer may be made of aluminum, aluminum silicon, carbon, or polyimide resin.

BRIEF DESCRIPTION OF DRAWINGS

FIG. 5 shows a plan view of a semiconductor device according to still another embodiment;

FIG. 6 shows a plan view of a semiconductor device according to still another embodiment;

FIG. 7 shows a plan view of a semiconductor device according to still another embodiment;

FIG. 8 shows a plan view of a semiconductor device according to still another embodiment.

DESCRIPTION OF EMBODIMENTS

Figure 1:
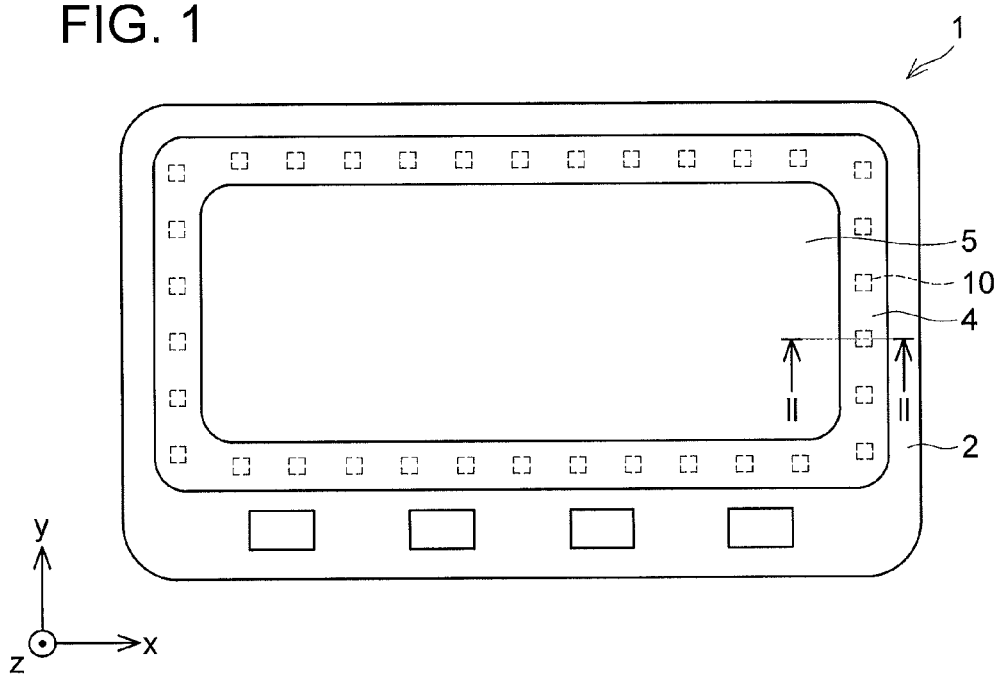
FIG. 1 shows a plan view of a semiconductor device according to an embodiment.
Figure 2:
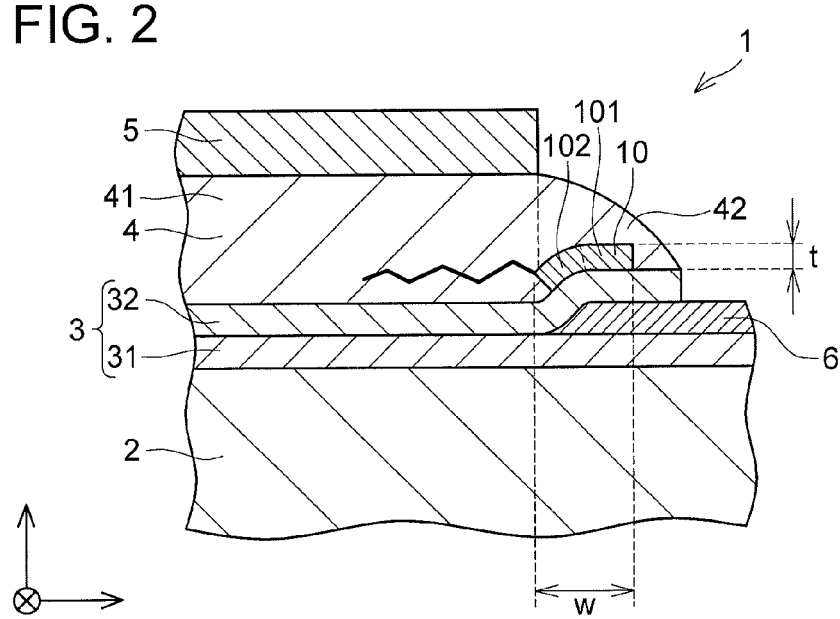
FIG. 2 shows a cross-sectional view that shows a main part of the semiconductor device in an enlarged manner (a cross-sectional view on II-II in FIG. 1)

Embodiments will hereinafter be described with reference to the attached drawings. As shown in FIGS. 1 and 2, a semiconductor device 1 according to an embodiment comprises a semiconductor layer 2, an electrode layer 3 arranged on the semiconductor layer 2, crack starting point layers 10 arranged above the semiconductor layer 2, and a solder layer 4 being in contact with the electrode layer 3 and the crack starting point layers 10. The respective layers are stacked along a vertical direction (z direction). Notably, although the crack starting point layers 10 are covered with the solder layer 4 and hence cannot in actuality be seen in the plan view in FIG. 1, the crack starting point layers 10 are indicated by solid lines in FIG. 1 for description purpose.

The semiconductor layer 2 is configured such that regions of n-type or p-type are formed by implanting impurities into a semiconductor substrate made of silicon (Si), silicon carbide (SiC), or the like, for example. As this semiconductor layer 2, a diode, a transistor, a thyristor, or the like can be used, for example. More specifically, a MOSFET (Metal Oxide Semiconductor Field Effect Transistor), an IGBT (Insulated Gate Bipolar Transistor), or the like can be used.

The electrode layer 3 comprises a first layer 31 arranged on a front surface of the semiconductor layer 2, and a second layer 32 arranged on a front surface of the first layer 31. The first layer 31 is in contact with the semiconductor layer 2, and the second layer 32 is in contact with the solder layer 4. A joining force between the solder layer 4 and the electrode layer 3 (the second layer 32) is larger than a joining force between the solder layer 4 and the crack starting point layers 10. To allow the electrode layer 3 (the second layer 32) to have a large joining force with the solder layer 4, the electrode layer 3 is configured to form an alloy more easily with the solder layer 4 than the crack starting point layers 10. Specifically, as a material of the second layer 32 on a front surface side of the electrode layer 3, which is bonded with the solder layer 4, a material that forms an alloy more easily with a material of the solder layer 4 than a material of the crack starting point layers 10 does is used. More specifically, as a material of the second layer 32, nickel (Ni) or copper (Cu) can be used, for example.

A protection layer 6 is arranged between an end portion of the first layer 31 and an end portion of the second layer 32, in the electrode layer 3. As a material of the protection layer 6, polyimide resin (PI) or the like can be used, for example.

The solder layer 4 is arranged on the front surface of the electrode layer 3. The solder layer 4 joins a joined member 5 to the electrode layer 3. The solder layer 4 fills between the electrode layer 3 and the joined member 5. The joined member 5 is not particularly limited, and is a lead frame made of a metal such as copper (Cu), for example. The joined member 5 conducts electricity with the electrode layer 3 via the solder layer 4. As a material of the solder layer 4, a known material for performing soldering can be used, and an alloy that contains tin (Sn), silver (Ag), or copper (Cu), for example, can be used as a main component. A thermal expansion coefficient of the solder layer 4 differs from a thermal expansion coefficient of the joined member 5. Moreover, the solder layer 4 includes a first region 41 located between the semiconductor layer 2 and the joined member 5, and a second region 42 located on an outer side relative to the first region 41. The first region 41 is arranged below the joined member 5. The second region 42 protrudes from the joined member 5 in a lateral direction (x direction), and is arranged over the protection layer 6. The crack starting point layers 10 are arranged within the second region 42.

The crack starting point layers 10 are arranged on the electrode layer 3, and arranged at boundary parts between the electrode layer 3 and the solder layer 4. The crack starting point layers 10 are arranged on the second layer 32 of the electrode layer 3. The crack starting point layers 10 are arranged at positions that are in contact with an end portion of the solder layer 4. The crack starting point layers 10 are entirely covered with the solder layer 4, and are embedded inside the solder layer 4. When the solder layer 4 is seen in the plan view, the solder layer 4 surrounds each crack starting point layer 10, and joins to the electrode layer 3 at a periphery of the crack starting point layer 10. The crack starting point layers 10 extend along the front surface of the electrode layer 3. Moreover, each crack starting point layer 10 comprises a first part 101 that extends in a direction along the front surface of the semiconductor layer 2 (lateral direction: the x direction), and a second part 102 that is tilted relative to the first part 101 and extends from the first part 101 toward a semiconductor layer 2 side. The first part 101 is located on the outer side (on an end portion side of the solder layer 4), and the second part 102 is located on the inner side relative to the first part 101. A contact surface between the solder layer 4 and each crack starting point layer 10 is bent at a boundary part between the first part 101 and the second part 102. Moreover, in the plan view, a plurality of the crack starting point layers 10 is arranged along the end portion of the solder layer 4. The solder layer 4 fills the periphery of each of the crack starting point layers 10. Moreover, the crack starting point layers 10 are arranged in a periphery of the joined member 5 so as to surround the joined member 5 in the plan view.

The joining force between the solder layer 4 and the crack starting point layers 10 is smaller than the joining force between the solder layer 4 and the electrode layer 3. To allow the crack starting point layers 10 to have a smaller joining force with the solder layer 4, the crack starting point layers 10 are configured to form an alloy less easily with the solder layer 4. Specifically, as a material of the crack starting point layers 10, a material that forms an alloy less easily with a material of the solder layer 4 (i.e., as the material of the crack starting point layers 10, a material that has poorer wettability with the material of the solder layer 4) is used. More specifically, as the material of the crack starting point layers 10, aluminum (Al), aluminum silicon (AlSi), carbon (C), polyimide resin (PI), or the like can be used, for example. Since the joining force between the solder layer 4 and the crack starting point layers 10 is smaller than the joining force between the solder layer 4 and the electrode layer 3, a crack easily runs into the solder layer 4, allowing the crack starting point layers 10 to serve as a starting point for the crack. With an object of allowing a crack to run into the solder layer 4 in the lateral direction (the x direction), a thickness t of each crack starting point layer 10 is preferably smaller than a width w of each crack starting point layer 10. The thickness t of each crack starting point layer 10 is a distance between edges of the crack starting point layer 10 in the vertical direction (the z direction), and the width w is a distance between edges of the crack starting point layer 10 in the lateral direction (the x direction).

According to the semiconductor device 1 comprising the above-described configuration, a voltage is applied to the semiconductor layer 2 to thereby cause a current to flow. When a current flows in the semiconductor layer 2, heat is generated, and a temperature of the semiconductor device 1 rises. When the application of voltage is stopped, the temperature of the semiconductor device 1 falls. At this occasion, due to the cycle of rising and falling in temperature, a stress is exerted on an inside of the semiconductor device 1. According to the above-described semiconductor device 1, when a stress is exerted on the inside, the crack starting point layers 10 serve as a starting point of a crack, and the crack runs into the solder layer 4. In other words, if the crack starting point layers 10 do not exist, there is no trigger for a crack, and hence the crack may run, not into the solder layer 4 but into the electrode layer 3. If the crack runs into the electrode layer 3, the semiconductor device can no longer be used. However, according to the above-described semiconductor device 1, the joining force between the solder layer 4 and the crack starting point layers 10 is smaller than the joining force between the solder layer 4 and the electrode layer 3, and hence a crack runs into the solder layer 4 prior to the electrode layer 3, allowing the crack starting point layers 10 to serve as a trigger. It can thereby be ensured that a crack is less likely to run into the electrode layer 3. Moreover, if a crack runs into the solder layer 4, an electrical resistance in the solder layer 4 is increased, and a degree of temperature rise becomes larger than usual. Accordingly, by detecting the temperature rise and issuing an alert, deterioration of the semiconductor device 1 can be avoided.

Moreover, the thickness t of each crack starting point layer 10 is smaller than the width w of each crack starting point layer 10, and hence the crack that occurs allowing the crack starting point layers 10 to serve as a starting point can be guided in a direction of the width (the x direction). It is thereby possible to suppress the crack from running in the vertical direction (the z direction), and it can be ensured that the crack is less likely to run from the solder layer 4 into the electrode layer 3 or the semiconductor layer 2. Moreover, since the crack starting point layers 10 are in contact with the end portion of the solder layer 4, and hence a crack can be caused to run into the end portion of the solder layer 4, and a crack can be prevented from occurring in a central portion of the solder layer 4.

Figure 3:
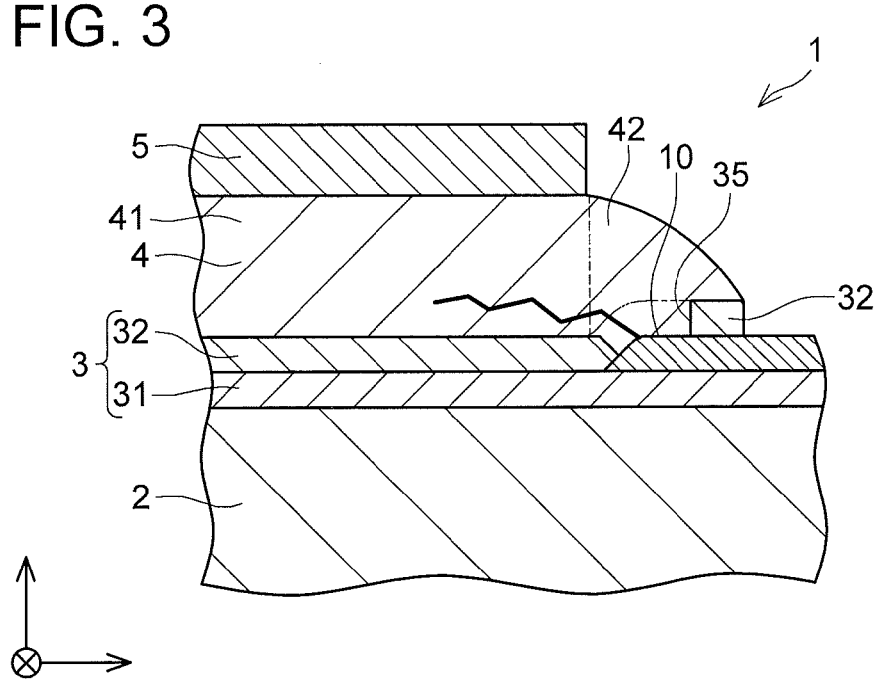
FIG. 3 shows a cross-sectional view that shows a main part of a semiconductor device according to another embodiment in an enlarged manner.

Although one embodiment has been described above, specific aspects are not limited to the above-described embodiment. For example, in the above-described embodiment, the crack starting point layers 10 are arranged on the second layer 32 of the electrode layer 3. However, the crack starting point layers 10 are not limited to this configuration, and may be arranged under the second layer 32. In another embodiment, as shown in FIG. 3, a crack starting point layer 10 is arranged on the first layer 31, and the second layer 32 is arranged on the crack starting point layer 10. The second layer 32 has an opening 35 formed therein at a position where the crack starting point layer 10 is arranged, and the crack starting point layer 10 is exposed from the opening 35. The solder layer 4 covers the opening 35, and is in contact with the exposed crack starting point layer 10. The crack starting point layer 10 in this configuration also has a function as the protection layer 6 in the semiconductor device 1 shown in FIG. 1. Notably, in FIG. 3, the same configurations as those in FIG. 2 have each the same sign attached thereto, and the descriptions thereof will be omitted.

Figure 4:
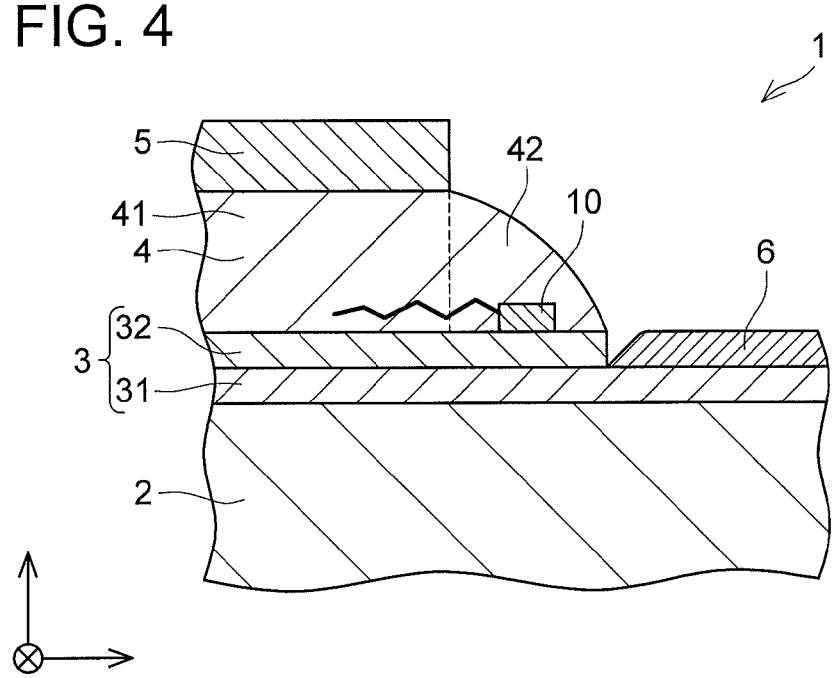
FIG. 4 shows a cross-sectional view that shows a main part of a semiconductor device according to still another embodiment in an enlarged manner.

Moreover, in the above-described embodiment, the end portion of the second layer 32 of the electrode layer 3 is arranged on the protection layer 6. However, the end portion of the second layer 32 is not limited thereto, and as shown in FIG. 4, may not be arranged on the protection layer 6. Notably, in FIG. 4, the same configurations as those in FIG. 2 have each the same sign attached thereto, and the descriptions thereof will be omitted.

Figure 9:
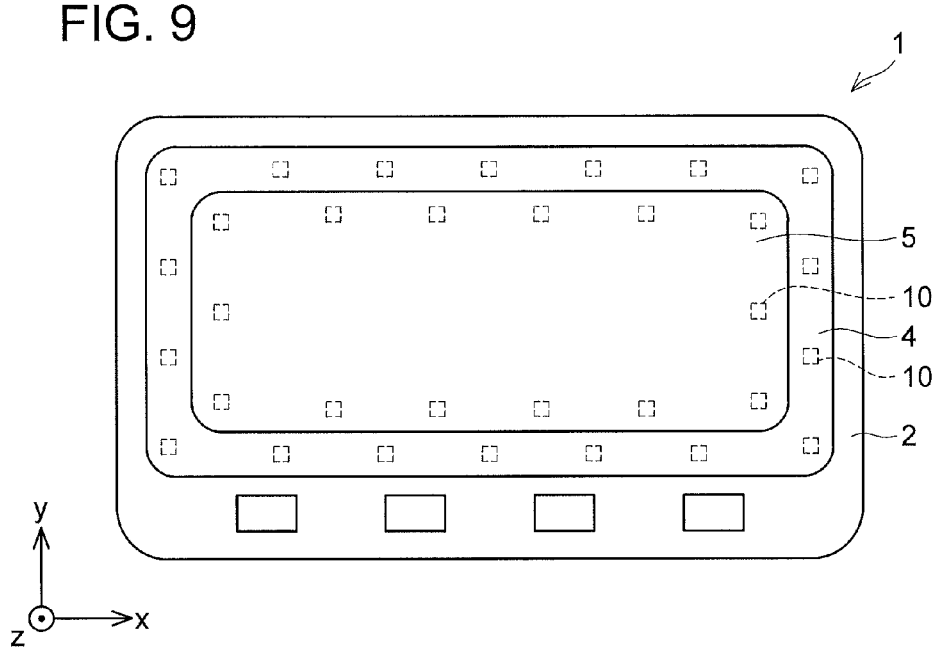
FIG. 9 shows a plan view of a semiconductor device according to still another embodiment.

Moreover, how the crack starting point layers 10 are arranged in the plan view is not particularly limited. For example, as shown in FIG. 5, each of crack starting point layers 10 may be arranged along the end portion of the solder layer 4 to extend in a straight line-like manner. Each crack starting point layer 10 is arranged to face an entirety of a corresponding side of the joined member 5. Moreover, as shown in FIG. 6, a plurality of crack starting point layers 10 may be arranged to face a corresponding side of the joined member 5. The plurality of the crack starting point layers 10 extends in a straight line-like manner, and these crack starting point layers 10 are arranged to be spaced apart from each other in a longitudinal direction. Moreover, as shown in FIG. 7, a plurality of crack starting point layers 10 may be arranged in two rows. One row of the crack starting point layers 10 is arranged at a position that overlaps the joined member 5 in the z direction, and the other row of the crack starting point layers 10 is arranged at a position that does not overlap the joined member 5 in the z direction. Moreover, as shown in FIG. 8, a plurality of crack starting point layers 10 may be arranged to face two sides (short sides) of the joined member 5. At positions that face the other two sides (long sides) of the joined member 5, the crack starting point layers 10 are not arranged. Moreover, as shown in FIG. 9, a plurality of crack starting point layers 10, which is arranged in two rows along each side of the joined member 5, may be arranged at positions offset from each other. For example, some of the plurality of the crack starting point layers 10, which are arranged in two rows along one side of the joined member 5 in the y direction, are offset from each other in the y direction such that the plurality of the crack starting point layers 10 do not overlap in the x direction. With each of the configurations shown in FIGS. 5 to 9 as well, a crack runs into the solder layer 4, allowing the crack starting point layers 10 to serve as a trigger for the crack. Notably, in FIGS. 5 to 9, the same configurations as those in FIG. 1 have each the same sign attached thereto, and the descriptions thereof will be omitted.

Specific examples of the present teachings has been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

REFERENCE SIGNS LIST

1: Semiconductor device
2: Semiconductor layer
3: Electrode layer
4: Solder layer
5: Joined member
6: Protection layer
10: Crack starting point layer
31: First layer
32: Second layer
35: Opening
41: First region
42: Second region
101: First part
102: Second part

The invention claimed is:
1. A semiconductor device comprising:
a semiconductor layer;
an electrode layer arranged on and being in contact with the semiconductor layer;
a crack starting point layer arranged on and being in contact with the electrode layer so that a part of the electrode layer is sandwiched between the crack starting point layer and the semiconductor layer; and
a solder layer arranged on and being in contact with the electrode layer and the crack starting point layer;
wherein
a joining force between the solder layer and the crack starting point layer is smaller than a joining force between the solder layer and the electrode layer, and
the crack starting point layer is arranged on the electrode layer, and
a thickness of the crack starting point layer is smaller than a width of the crack starting point layer.
2. The semiconductor device according to claim 1, wherein
the electrode layer is made of a material that forms an alloy more easily with the solder layer than the crack starting point layer.
3. The semiconductor device according to claim 1, wherein
the crack starting point layer is made of aluminum, aluminum silicon, carbon, or polyimide resin.

* * * * *